(12) United States Patent
Lee

(10) Patent No.: US 10,784,607 B2
(45) Date of Patent: Sep. 22, 2020

(54) GOLDEN FINGER DESIGN METHODOLOGY FOR HIGH SPEED DIFFERENTIAL SIGNAL INTERCONNECTIONS

(71) Applicant: QUANTA COMPUTER INC., Taoyuan (TW)

(72) Inventor: Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/418,271

(22) Filed: May 21, 2019

(65) Prior Publication Data

US 2020/0212610 A1 Jul. 2, 2020

Related U.S. Application Data

(60) Provisional application No. 62/785,320, filed on Dec. 27, 2018.

(51) Int. Cl.
*H05K 1/00* (2006.01)
*H01R 12/73* (2011.01)
*H05K 1/02* (2006.01)

(52) U.S. Cl.
CPC ......... *H01R 12/737* (2013.01); *H05K 1/0213* (2013.01); *H05K 2201/09227* (2013.01); *H05K 2201/09236* (2013.01); *H05K 2201/1034* (2013.01); *H05K 2201/10325* (2013.01)

(58) Field of Classification Search
USPC ........................................................ 361/748
See application file for complete search history.

(56) References Cited

U.S. PATENT DOCUMENTS

| | | | |
|---|---|---|---|
| 5,852,725 A * | 12/1998 | Yen | ........................ G06F 13/409 710/301 |
| 5,963,431 A | 10/1999 | Stancil | |
| 6,520,802 B1 * | 2/2003 | Mitra | ..................... H01R 13/05 439/541.5 |
| 2002/0084876 A1 | 7/2002 | Wright et al. | |
| 2007/0152768 A1 | 7/2007 | Mellitz et al. | |
| 2014/0277827 A1 * | 9/2014 | Chinnadurai | .......... G07C 5/008 701/1 |
| 2016/0165728 A1 | 6/2016 | Fullam et al. | |

OTHER PUBLICATIONS

Extended European Search Report for EP Application No. 19188960. 9, dated Feb. 24, 2020.

* cited by examiner

*Primary Examiner* — Andargie M Aychillhum
(74) *Attorney, Agent, or Firm* — Nixon Peabody LLP

(57) ABSTRACT

A connector assembly is disclosed to reduce discontinuity impedance between golden finger connectors and components on a circuit board. The assembly includes a circuit board including a connector edge. A plurality of connectors is formed on the connector edge on a first surface of the circuit board. A ground plane is formed on part of the circuit board on a second opposite surface of the first surface. The ground plane leaves the second opposite surface under the connector edge exposed. A ground loop is formed on the second opposite surface under at least two of the plurality of connectors.

14 Claims, 5 Drawing Sheets

US 10,784,607 B2

GOLDEN FINGER DESIGN METHODOLOGY FOR HIGH SPEED DIFFERENTIAL SIGNAL INTERCONNECTIONS

PRIORITY CLAIM

This application claims priority under 35 U.S.C. § 119 to U.S. Provisional Application No. 62/785,320, filed on Dec. 27, 2018. The contents of that application are hereby incorporated by reference in their entirety.

TECHNICAL FIELD

The present disclosure relates generally to connectors. More particularly, aspects of this disclosure relate to a golden finger connector with a ground ring to reduce impedance between connections.

BACKGROUND

Electronic devices, such as servers, include numerous electronic components that are in a modular form. For example, many servers include device cards such as the device card 10 shown in FIG. 1. Modular device cards provide flexibility for the server because they allow different functional components to be added to the server. The device card 10 includes an edge region 12, that includes golden finger connectors 14 that are formed on the edge region 12. The edge region 12 may be plugged into a socket 20 that may be on a circuit board of a device, such as a server or another circuit board. The golden finger connectors 14 are termed golden fingers because they are finger shaped, and are fabricated from a durable metal to allow repeated connection with the socket 20. The connectors 14 are electrically connected to circuit traces formed on the device card 10. The connectors 14 allow the server to exchange signals with components on the device card 10. The edge region 12 is defined by a ground region 18 on the card 10. The ground region 18 generally underlies the general area of the device card 10. However, the ground region 18 is not extended under the edge region 12.

Servers typically have a motherboard with a controller or controllers and several sockets for connecting riser boards. A riser board has an edge region that may be mated with the sockets on the motherboard. The riser board also includes multiple sockets, such as the socket 20, that allow the insertion of device cards, such as the device card 10. Thus, a server motherboard may be connected to multiple device cards via each riser board. Each of the device cards are connected via the riser board to the sockets on the motherboard.

An example riser board 50 is shown in FIG. 1B. The riser board 50 includes an edge region 52 with golden finger connectors 54. The riser board 50 also includes multiple sockets such as sockets 62 and 64 that allow multiple cards to be connected to a single socket on a server motherboard through the riser board 50. The riser board 50 includes traces 66 that connect the golden finger connectors to the sockets 62 and 64. Thus electrical signals may be exchanged between the sockets 62 and 64, and the devices connected to the golden finger connectors 54, such as a server motherboard.

As explained above, the golden finger type connector is widely used in signal linkage for input/output expansion devices, such as the device card 10 in FIG. 1A, and in conjunction with riser boards, such as the riser board 50 in FIG. 1B. However, there is typically impedance discontinuity caused by the golden finger connectors on a riser or linkage board of a server system. For riser or linkage boards with a short trace length between the golden finger connectors and the sockets, there are two impedance discontinuity bonding areas at both ends of the riser board since there are two connections (one between the riser board and the server motherboard and the other between the riser board and the device card). These discontinuities cause multiple reflections when signals are transmitted over the golden finger connectors. This kind of structural defect will further decrease signal margin and cause unexpected failure in signals between boards owing to margin reduction.

Current design requirements generally cut out the ground plane under the edge with the golden finger connectors to increase impedance, since the relatively larger golden finger connectors enormously reduce corresponding impedance.

FIG. 2A shows a top view of golden finger connectors on a riser board 100. FIG. 2B shows a perspective view of the riser board 100. The riser board 100 includes an edge region 102, a ground plane 104, and a board layer 106. As explained above, the ground plane 104 extends under the board layer 106 but does not extend under the edge region 102. The edge region 102 includes a series of golden finger connectors 110. Various circuit traces 112 are electrically connected to the proximal end of the golden finger connectors 110. The opposite distal ends of the golden finger connectors 110 are left open for contact with the corresponding connecting surfaces in a socket. A series of connector holes 120 are formed on the board 106 to provide electrical connections to sockets or other components on the riser board 100.

As signal data transmission rates increase, side effects for the golden finger structure shown in FIGS. 2A-2B occur. There will be multiple reflections caused between regions designated as 150 and 152 on the riser board 100 from signals on the golden finger connector 110. Such reflections will cause signal margin reduction. For example, the original channel loss is around −0.5 dB but becomes −4.97 dB when probing at the center position of a golden finger connector. This shows that there is an additional loss (−4.97−(−0.5)=−4.47 Db) is caused by reflections. One method to solve this problem is to increase the length of the traces between the golden finger connectors and the sockets to reduce the magnitude of signal reflection. Such a solution is not generally feasible given the height constraints for a riser board used for rack mounted servers. For example, the height of a riser board is limited in 1U or 2U server, and thus trace length is limited by the height of the riser board.

Thus, there is a need for a circuit board edge design to reduce impedance discontinuity of golden finger area to reduce reflection of signals. There is a further need for a mechanism to allow a minimal trace length between a golden finger type connector and sockets on a riser board to allow the riser board to fit in standard server design heights.

SUMMARY

One disclosed example is a circuit device including a circuit board including a connector edge. A plurality of connectors is formed on the connector edge on a first surface of the circuit board. A ground plane is formed on part of the circuit board on a second opposite surface of the first surface. The ground plane leaves the second opposite surface under the connector edge exposed. A ground loop is formed on the second opposite surface under at least two of the plurality of connectors.

Another disclosed example is a riser card for connecting card devices to a server board. The riser card includes a circuit board having a first surface and an opposite second surface. The circuit board includes a connector edge region with a plurality of connectors formed on the first surface. A ground plane is formed on the second surface. The ground plane forms an exposed area of the second surface under the connector edge region. A ground loop is formed on the second surface under the edge region. A plurality of traces is electrically connected to the plurality of connectors. The riser card includes a socket on the first surface. The socket is electrically connected to at least some of the plurality of traces.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
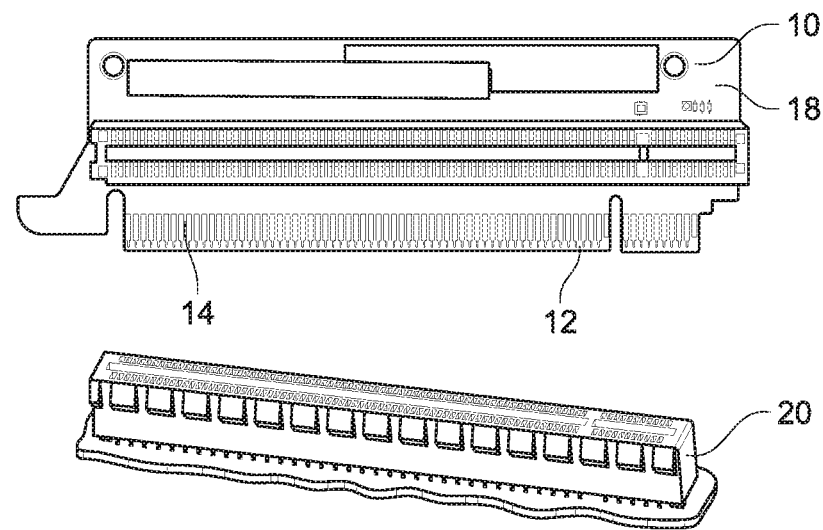
FIG. 1A is a perspective view of a prior art circuit board with golden finger type connectors and matching socket.
Figure 1B:
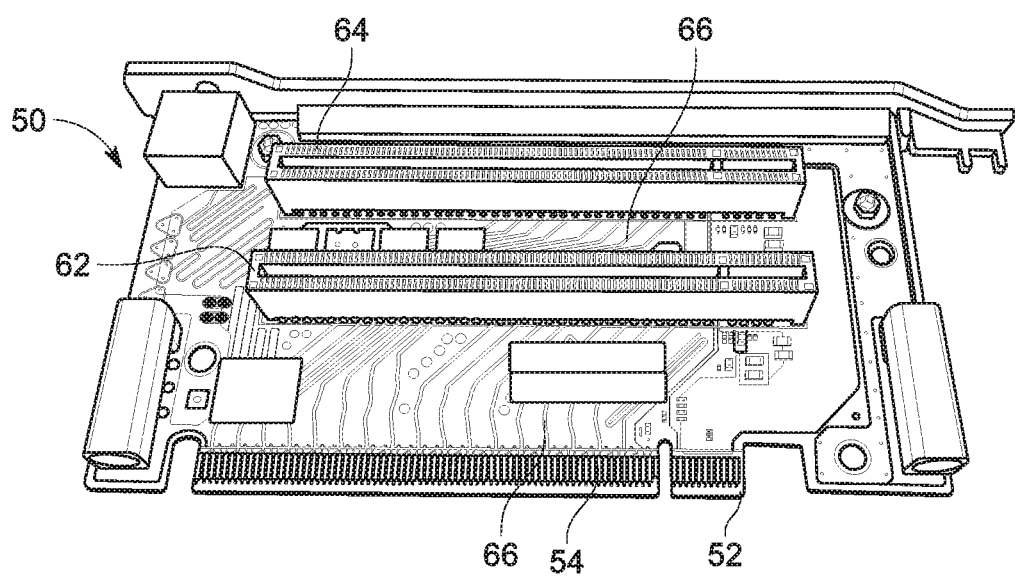
FIG. 1B is a perspective view of a prior art riser board having golden finger type connectors to connect to a motherboard and sockets for device cards.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to the addition of a ground ring or loop that extends under golden finger connectors in the edge connector region of a circuit board. The ground ring reduces impedance discontinuity and corresponding reflection of signals carried by the golden finger connectors. The ground ring may be any shape but must be connected to the ground plane. In this example, one loop is formed for each of four golden finger connectors.

Figure 3A:
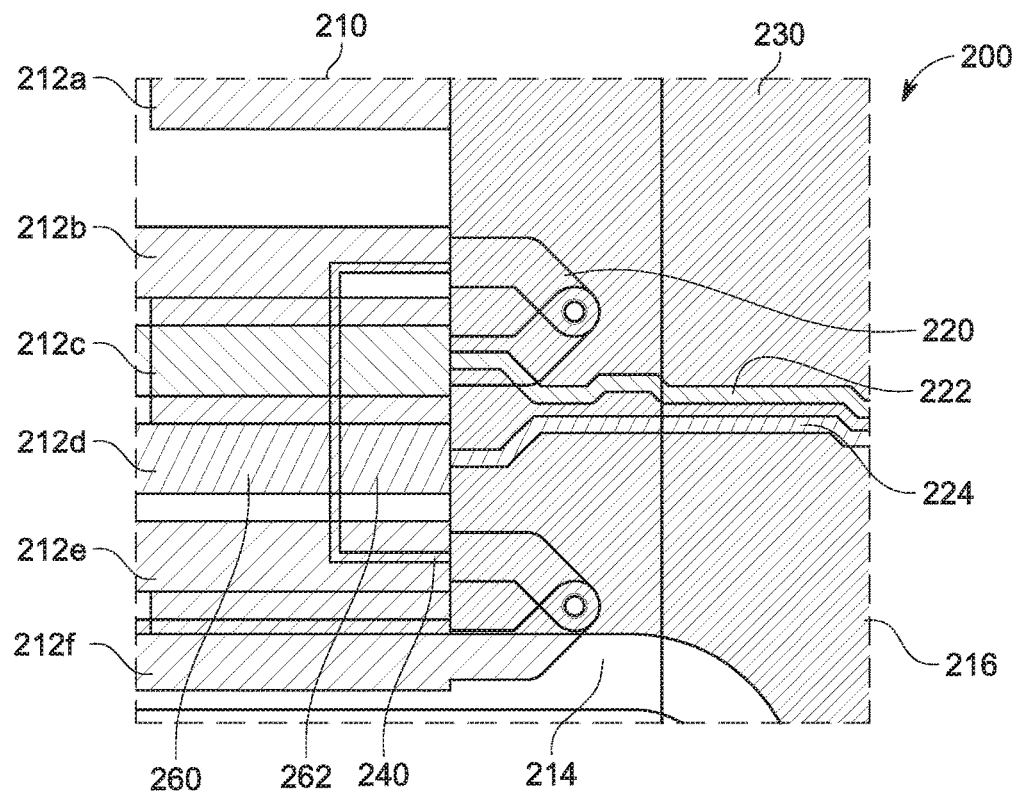
FIG. 3A shows a close up top view of an example improved golden finger connector design with an underlying ground loop.
Figure 3B:
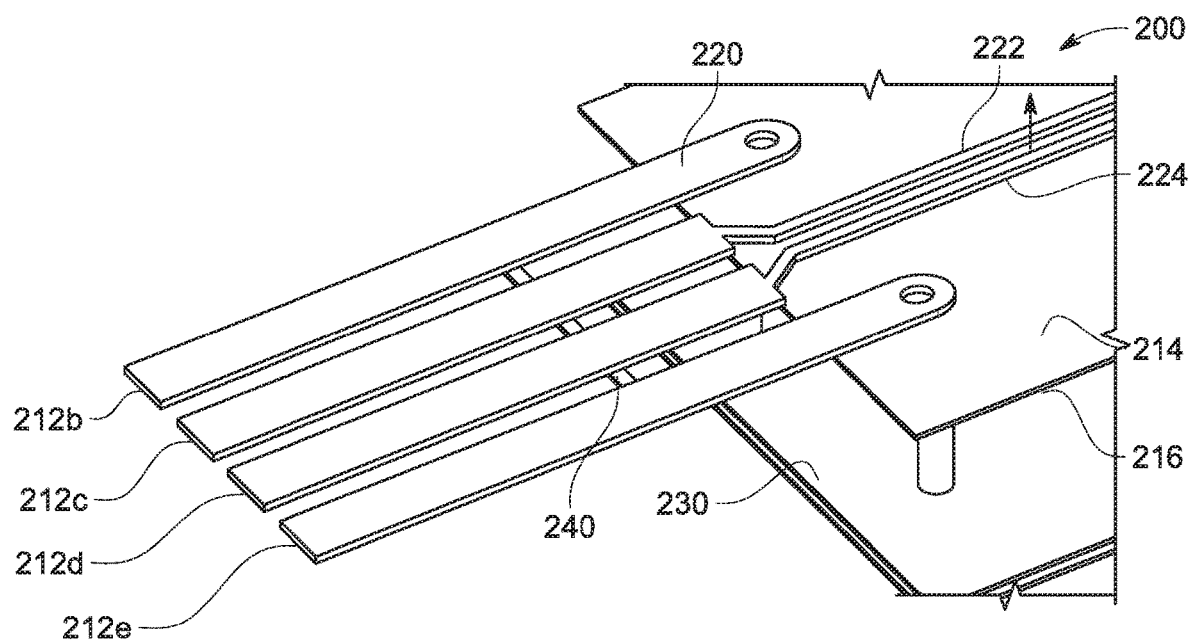
FIG. 3B is a perspective view of the circuit board layout of the example improved golden finger connector design with an underlying ground loop.

FIG. 3A shows a close up top view of a circuit board 200 having an edge region 210 that includes golden finger connectors 212a, 212b, 212c, 212d, 212e, 212f, and 212g formed on a circuit board surface 214. FIG. 3B shows a perspective view of the circuit board 200 with the golden finger connectors 212a, 212b, 212c, 212d, 212e, 212f, and 212g. The circuit board 200 also has an opposite surface 216 under the circuit board surface 214. Various traces 220 are formed on the circuit board surface 214. In this example, the circuit board 200 is fabricated from non-conductive material. The circuit board 200 may include other components such as integrated circuits or sockets on the circuit board surface 214 that exchange signals with the connectors 212a, 212b, 212c, 212d, 212e, 212f, and 212g. In this example, the circuit board 200 may be a device card such as a solid state drive (SSD) card or a connector type card such as a riser card that allows multiple device cards to be connected to another circuit board, such as the motherboard of a server.

For example, a differential signal trace pair may be defined by a first trace 222 connected to golden finger connector 212c, and a second trace 224 connected to golden finger connector 212d. A differential electronic signal may thus be sent and received from a socket over the golden finger connectors 212c and 212d. A ground plane 230 is provided under the circuit board surface 214 on the opposite surface 216. As may be seen in FIG. 3, the ground plane 230 does not extend under the edge region 210.

In order to address the reflection problem discussed above, a ground loop 240 is formed to extend from the ground plane 230 on the exposed surface 214 under the edge region 210. In this example, the ground loop 240 and ground plane 230 are fabricated from copper. In this example, the ground loop 240 extends under the golden finger connectors 212b, 212c, 212d, and 212e. The added ring or ground loop 240 under the area of the edge region 210 with the connectors 212b, 212c, 212d, and 212e reduces impedance discontinuity and corresponding reflection. In this example, due to the ground loop 240, there will be 2.2 dB margin gain back from channel loss comparing with current known golden finger connector designs, such as those shown in FIG. 2B.

Figure 2A:
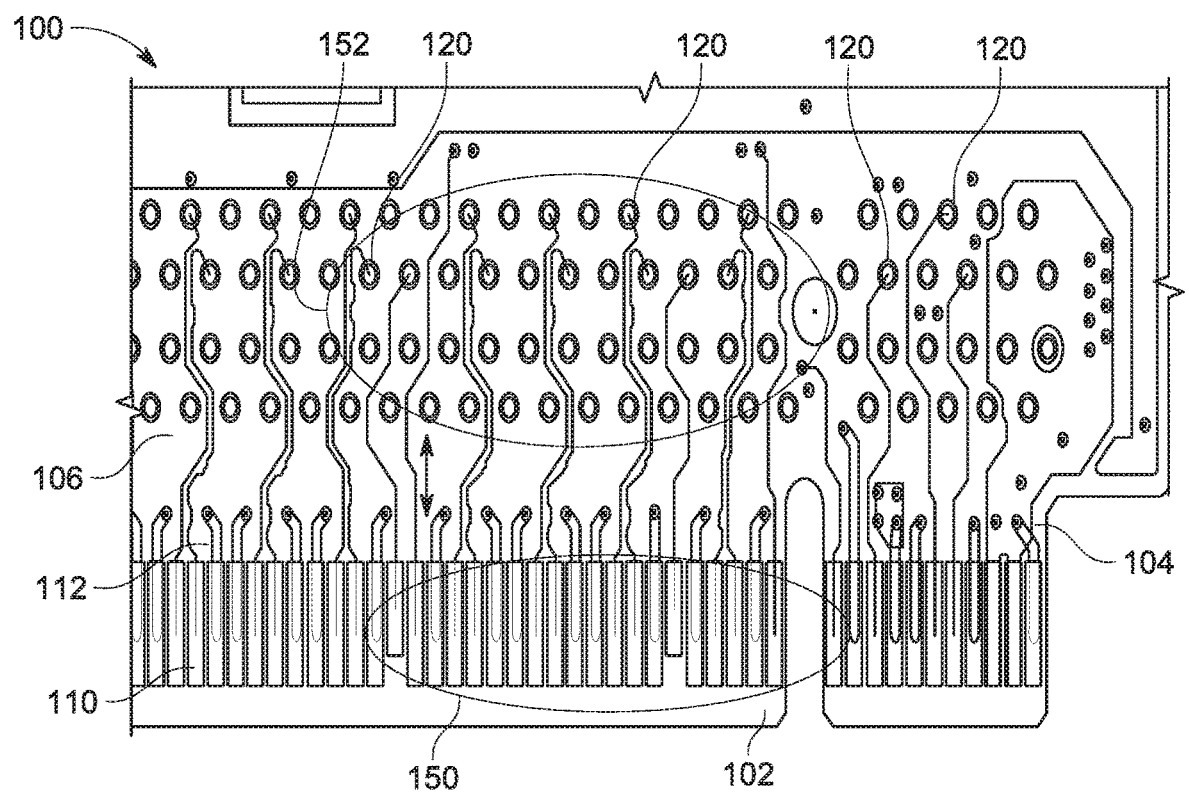
FIG. 2A is a close up view of a prior art connector in a riser board that shows areas of potential signal discontinuities.
Figure 2B:
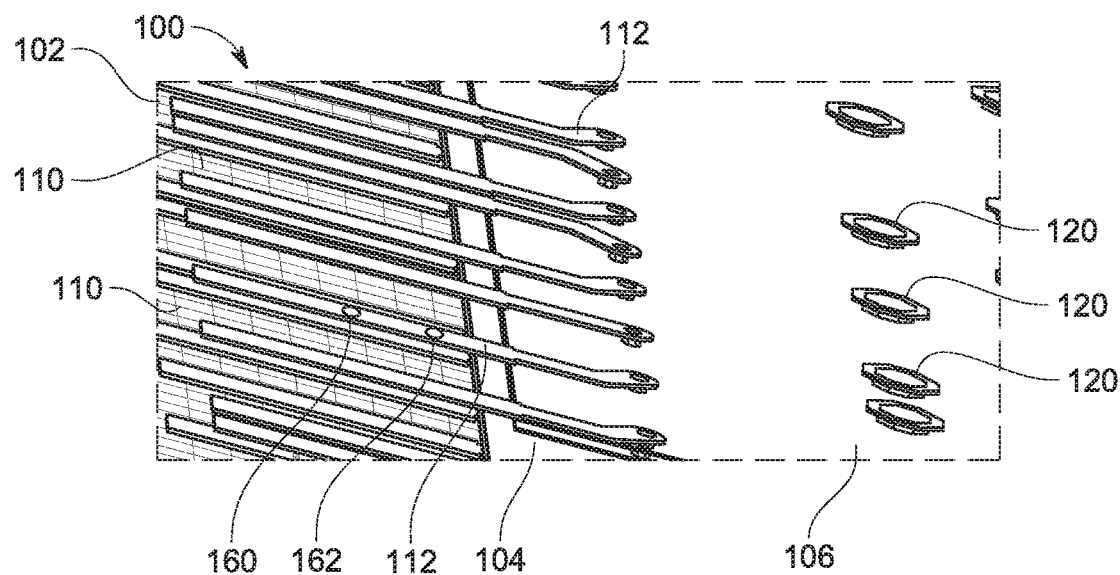
FIG. 2B is a perspective view of an example prior art edge region with golden finger connectors.

The effectiveness of the ground loop 240 may be tested by determining signals from the previously known circuit boards with golden finger connectors (such as those shown in FIG. 2B) and comparing such signals to the improved golden finger connectors with an underlying ground loop (as shown in FIGS. 3A-3B). In such a determination, two probe points 160 and 162 are provided (as shown in FIG. 2B) to measure differential signal channel s-parameters or impedance from differential signals on the golden finger connectors. The first probe point 160 is positioned approximately half the length of the golden finger connector 110 from the edge of the ground plane 104 (FIG. 2B). The second probe point 162 is positioned approximately a third of the length of the golden finger connector 110 from the edge of the ground plane 104. Similarly, probe points 260 and 262 are provided on the differential signal trace 224 in FIG. 3. The probe point 260 is positioned approximately half the length of the golden finger 212d from the edge of the ground plane 230, while the probe point 262 is positioned approximately a third of the length of the golden finger 212d from the edge of the ground plane 230.

Figure 4:
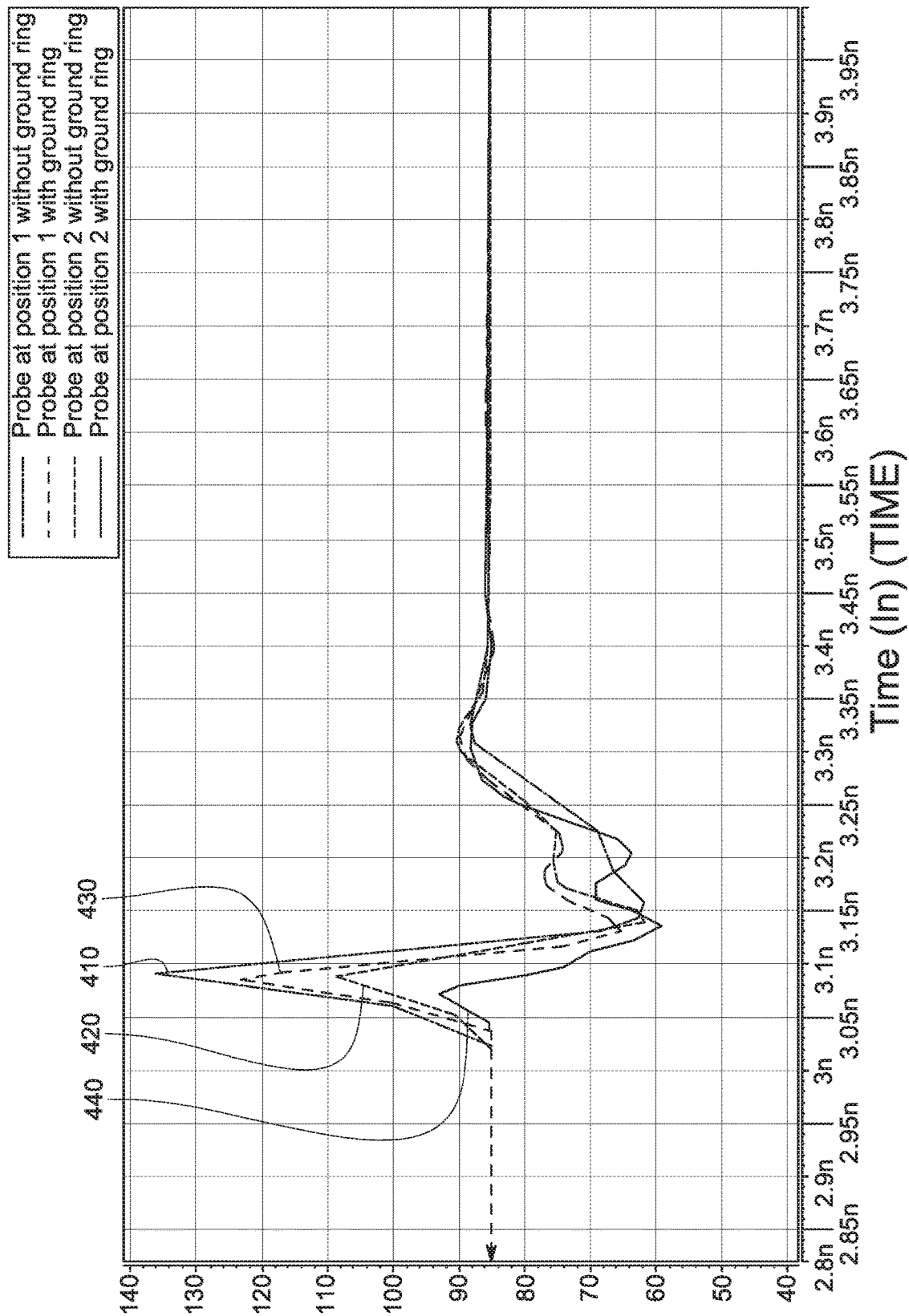
FIG. 4 is a graph of the signal output of probes connected to the example improved golden finger connector design in FIGS. 3A-3B, in comparison to a prior art golden finger connector.

FIG. 4 is a graph showing the resistance measured from the probe points 160 and 162 in FIG. 2B and probe points 260 and 262 in FIG. 3A over time when a differential signal is applied to the respective golden finger connectors. The graph in FIG. 4 shows resistance (in ohms) on the y axis and time in nanoseconds on the x-axis. A first trace 410 shows the output of the probe 160 in FIG. 2B over time without the ground ring. A second trace 420 shows the output of the probe 162 in FIG. 2B over time without the ground ring. A third trace 430 shows the output of the probe at the probe point 260 in FIG. 3A over time with the ground loop 240. A fourth trace 440 shows the output of the probe at the probe point 262 in FIG. 3A over time with the ground loop 240. As may be seen in FIG. 4, the traces 410, 420, 430, and 440 show differential signal channel impedance of the four different conditions. The lower resistance means that the channel impedance is closer to an original target. Thus the lower resistance of traces 430 and 440 in comparison with traces 410 and 420 provide smaller impedance deviation and smaller signal reflection due to the ground ring 240.

Figure 5:
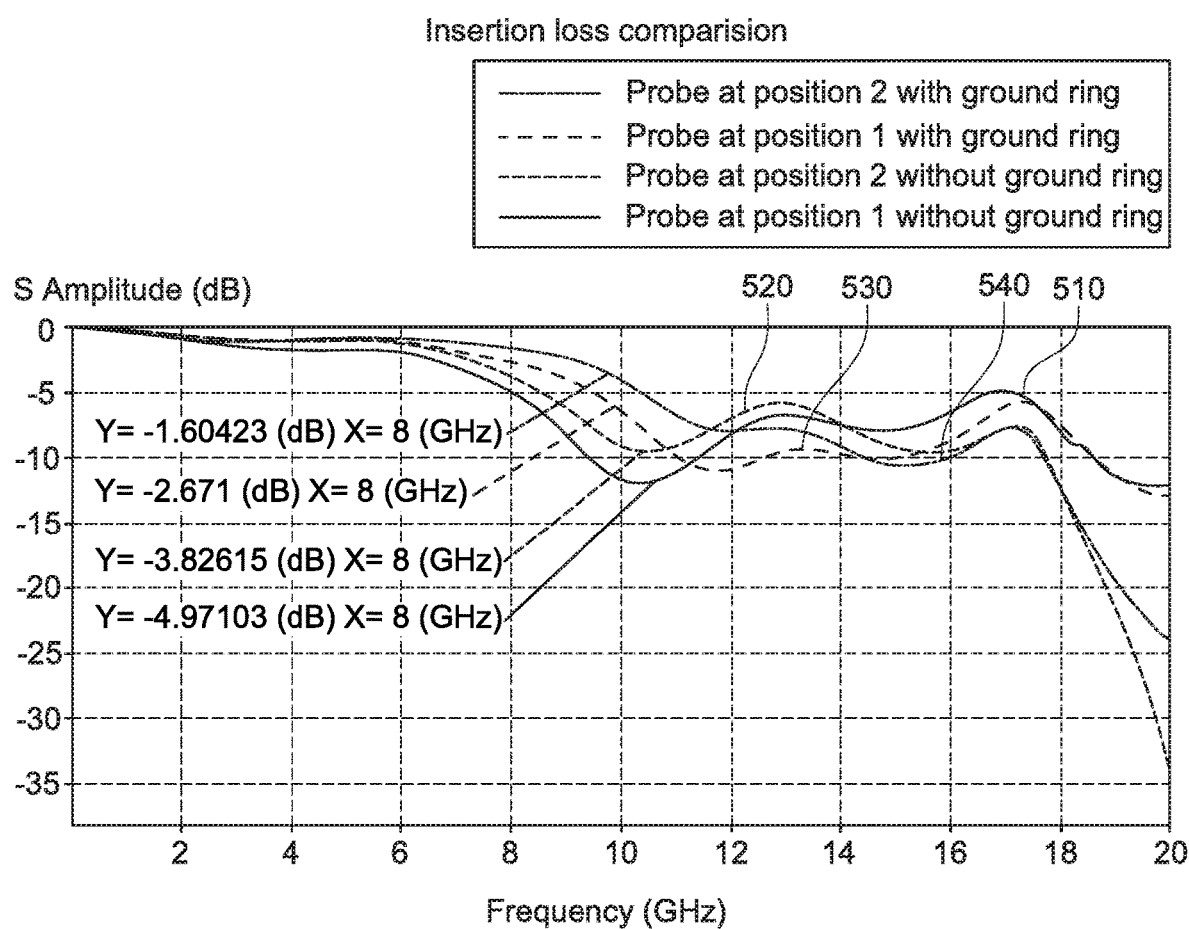
FIG. 5 is a graph of the signal output at different frequencies of probes connected to the example improved golden finger connector in FIGS. 3A-3B, in comparison to a prior art golden finger connector.

FIG. 5 is a graph showing the insertion loss comparison of signals from the probe points 160 and 162 in FIG. 2B and probe points 260 and 262 in FIG. 3A when a differential signal is applied to the respective golden finger connectors. The graph in FIG. 5 shows the signal amplitude in dB on the y axis and frequency of the signal in GHz on the x-axis. A first trace 510 shows the output in dB of the probe 160 in FIG. 2B over a range of frequencies without the ground ring. A second trace 520 shows the output of the probe 162 in FIG. 2B over a range of frequencies without the ground ring. A third trace 530 shows the output of the probe at the probe point 260 in FIG. 3A over a range of frequencies with the ground loop 240. A fourth trace 540 shows the output of the probe at the probe point 262 in FIG. 3A over a range of frequencies with the ground loop 240. FIG. 5 specifically demonstrates that the insertion loss comparison in dB at 8 GHz (the major frequency for PCIe Gen4 (16 Gbps) applications) for the probe points 260 and 262 (1.60 and 2.60) is less than the corresponding loss at probe points 160 and 162 (3.82 and 4.97).

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A circuit device, comprising:
    a circuit board including a connector edge;
    a plurality of connectors formed on the connector edge on a first surface of the circuit board;
    a ground plane formed on a part of the circuit board, the ground plane being on a second opposite surface of the first surface, wherein the ground plane leaves the second opposite surface under the connector edge exposed; and
    a ground loop formed on the second opposite surface under at least two of the plurality of connectors, wherein the ground loop is electrically coupled to the ground plane.

2. The circuit device of claim 1, wherein the plurality of connectors are golden finger type connectors.

3. The circuit device of claim 1, further comprising a socket on the first surface of the circuit board, wherein the socket is electrically connected to at least two of the plurality of connectors via traces on the first surface of the circuit board.

4. The circuit device of claim 3, further comprising a circuit card having a mating connector coupled to the socket.

5. The circuit device of claim 1, wherein the ground loop is a rectangular shape.

6. The circuit device of claim 1, wherein the materials of the ground loop and the ground plane are copper.

7. The circuit device of claim 1, wherein the ground loop is formed under four of the plurality of connectors.

8. A riser card for connecting card devices to a server board, the riser card comprising:
    a circuit board having a first surface and an opposite second surface, the circuit board including a connector edge region including a plurality of connectors formed on the first surface;
    a ground plane formed on the second surface, wherein the ground plane forms an exposed area of the second surface under the connector edge region;

a ground loop formed on the second surface under the edge region, wherein the ground loop is electrically coupled to the ground plane;

a plurality of traces electrically connected to the plurality of connectors; and a socket on the first surface, the socket electrically connected to at least two of the plurality of traces.

9. The riser card of claim 8, wherein the plurality of connectors are golden finger type connectors.

10. The riser card of claim 8, further comprising a second socket on the first surface of the circuit board, wherein the second socket is electrically connected to at least two of the plurality of connectors via at least two of the plurality of traces.

11. The riser card of claim 8, further comprising a device card having a mating connector coupled to the socket.

12. The riser card of claim 8, wherein the ground loop is a rectangular shape.

13. The riser card of claim 8, wherein the materials of the ground loop and the ground plane are copper.

14. The riser card of claim 8, wherein the ground loop is formed under four of the plurality of connectors.

\* \* \* \* \*